United States Patent

Singh et al.

(10) Patent No.: US 6,668,247 B2
(45) Date of Patent: Dec. 23, 2003

(54) METHOD AND SYSTEM FOR DETERMINING STATE-OF-HEALTH OF A LEAD-ACID DEFIBRILLATOR BATTERY USING AN INTELLIGENT SYSTEM

(75) Inventors: Pritpal Singh, Media, PA (US); Craig Fennie, Jr., New Brunswick, NJ (US); David E. Reisner, Bristol, CT (US)

(73) Assignee: U.S. Nanocorp, Farmington, CT (US)

( * ) Notice: Subject to any disclaimer, the term of this patent is extended or adjusted under 35 U.S.C. 154(b) by 0 days.

(21) Appl. No.: 10/122,571

(22) Filed: Apr. 15, 2002

(65) Prior Publication Data

US 2003/0061181 A1 Mar. 27, 2003

Related U.S. Application Data

(63) Continuation-in-part of application No. 09/041,501, filed on Mar. 12, 1998, now Pat. No. 6,456,988.
(60) Provisional application No. 60/040,476, filed on Mar. 12, 1997, and provisional application No. 60/051,165, filed on Jun. 27, 1997.

(51) Int. Cl.[7] .................... G06F 15/18; G01R 31/36; H02J 7/00
(52) U.S. Cl. .................... 706/2; 706/900; 706/902; 702/63; 320/130; 320/134
(58) Field of Search .................... 706/2, 900, 902; 702/63; 320/130, 134

(56) References Cited

U.S. PATENT DOCUMENTS

| | | | |
|---|---|---|---|
| 3,720,869 A | 3/1973 | Rowlette | 324/29.5 |
| 3,895,284 A | 7/1975 | Schweizer et al. | 320/48 |
| 3,984,762 A | 10/1976 | Dowgiallo, Jr. | 324/29.5 |
| 4,307,330 A | 12/1981 | Belot | 320/44 |
| 4,433,295 A | 2/1984 | Zaugg | 324/429 |
| 4,595,880 A | 6/1986 | Patil | 324/427 |

(List continued on next page.)

FOREIGN PATENT DOCUMENTS

JP 6-242192 9/1994

OTHER PUBLICATIONS

Isidor Buchmann "Artificial Intelligence Reads Battery State–of–Health in Three Minutes", IEEE The 16th Annual Battery Conference on Applications and Advances, Sep.–Dec. 2001.*

(List continued on next page.)

Primary Examiner—George B. Davis
(74) Attorney, Agent, or Firm—Cantor Colburn LLP

(57) ABSTRACT

A method of and system for determining the state-of-health of a lead acid battery of the type commonly used in portable external defibrillators comprises detecting an impedance characteristic of the battery at at least one selected frequency, counting the number of complete charge/discharge cycles that the battery undergoes, and determining the state of health of the battery from a fuzzy system trained in a relationship between the impedance characteristic and the cycle number of the lead acid battery and the state-of-health, wherein the state-of-health is a function of and varies with the battery's ability to deliver power required by the load and the battery's capacity to meet load requirements.

18 Claims, 5 Drawing Sheets

U.S. PATENT DOCUMENTS

| | | | |
|---|---|---|---|
| 4,638,237 A | 1/1987 | Fernandez | 320/48 |
| 4,677,363 A | 6/1987 | Kopmann | 320/44 |
| 4,743,855 A | 5/1988 | Randin et al. | 324/430 |
| 4,775,827 A | 10/1988 | Ijntema et al. | 320/44 |
| 4,876,513 A | 10/1989 | Brilmyer et al. | 324/427 |
| 4,947,123 A | 8/1990 | Minezawa | 324/427 |
| 4,958,127 A | 9/1990 | Williams et al. | 324/426 |
| 5,159,272 A | 10/1992 | Rao et al. | 324/429 |
| 5,241,275 A | 8/1993 | Fang | 324/430 |
| 5,284,719 A | 2/1994 | Landau et al. | 429/50 |
| 5,321,627 A | 6/1994 | Reher | 364/483 |
| 5,349,540 A | 9/1994 | Birkle et al. | 364/578 |
| 5,369,364 A | 11/1994 | Renirie et al. | 324/430 |
| 5,372,898 A | 12/1994 | Atwater et al. | 429/90 |
| 5,381,096 A | 1/1995 | Hirzel | 324/427 |
| 5,404,106 A | 4/1995 | Matsuda | 324/431 |
| 5,451,881 A | 9/1995 | Finger | 324/433 |
| 5,457,377 A | 10/1995 | Jonsson | 320/5 |
| 5,541,489 A | 7/1996 | Dunstan | 320/2 |
| 5,587,660 A | 12/1996 | Chabbert et al. | 324/426 |
| 5,614,829 A | 3/1997 | Song | 324/427 |
| 5,631,540 A | 5/1997 | Nguyen | 320/30 |
| 5,654,903 A | 8/1997 | Reitman et al. | 364/551.01 |
| 5,656,919 A | 8/1997 | Proctor et al. | 320/30 |
| 5,659,240 A | 8/1997 | King | 320/30 |
| 5,670,861 A | 9/1997 | Nor | 320/15 |
| 5,701,078 A | 12/1997 | Lee et al. | 324/430 |
| 5,703,464 A | 12/1997 | Karunasiri et al. | 320/19 |
| 5,705,929 A | 1/1998 | Caravello et al. | 324/430 |
| 5,825,156 A | 10/1998 | Patillon et al. | 320/21 |
| 5,936,385 A | 8/1999 | Patillon et al. | 320/136 |
| 6,011,379 A | 1/2000 | Singh et al. | 320/132 |
| 6,331,762 B1 * | 12/2001 | Bertness | 320/134 |
| 6,392,386 B2 * | 5/2002 | Schulmayr et al. | 320/132 |
| 6,416,485 B1 * | 7/2002 | Rovetta et al. | 600/595 |
| 6,566,883 B1 * | 5/2003 | Vonderhaar et al. | 324/426 |
| 2001/0022509 A1 * | 9/2001 | Schulmayr et al. | 320/132 |
| 2003/0025481 A1 * | 2/2003 | Bertness | 320/155 |

OTHER PUBLICATIONS

Suntio et al, "Condition Monitoring of Storage Batteries in Telecom Power Systems—Crisp vs. Soft Computing Methodology", IEEE Workshop on SCMIA, Jun. 1999.*

Pascoe et al, "Adaptive Fuzzy Coup De Fouet Based VRLA Battery Capacity Estimation", IEEE International Conference on Systems, Man, and Cybernetics, Oct. 2001.*

Spath et al, "The Detection of the State of Health of Lead–Acid Batteries", IEEE, INTELEC, Oct. 1997.*

Ultah et al., "Fast Intelligent Battery Charging: Neural Fuzzy Approach", IEEE AES Systems Magazine; Jun. 1996.

Cerruto, et al., "Energy Flows Management In Hybrid Vehicles By Fuzzy Logic Controller", IEEE proceedings of the 7th Mediterranean Electrotechnical Conference; Apr. 1994.

Poulin et al., "An Expert Management System for URLA Batteries In Remote Telecommunication Centers", IEEE INTELEC, the 16th Inter. Telecommunications Energy Conference; Nov. 1994.

Brady, et al., "A Symbolic Programming Approach To Intelligent Data Reduction"; IEEE Proceedings of the 24th Intersociety Energy Conversion Engineering Conference; Aug. 1989.

S. Sathyanarayana, S. Venugopalan, M.L. Gopikanth, "Impedance parameters and the state–of–charge. I. Nickel–cadmium battery", Journal of Applied Electrochemistry (1979), pp. 125–139.

S.A.G R. Karunathilaka, N. A. Hampson, T.P. Haas, W. G. Marshall, R. Leek and T.J. SInclair, "The impedance of the alkaline zinc–mercuric oxide cell. I. Cell behavior and interpretation of impedance spectra", Journal of Applied Electrochemistry (1981); pp. 573–582.

Naoki, et al., "Estimation of the state of charge of Sealed Lead Battery by Neural Networks", Institute of Electronics, Information and Communication Engineers, 1996.

Naoki, et al., "Prediction of the Capacity of Sealed Lead Battery by Neural Networks", Institute Of Electronics, Information and Communication Engineers, 1996.

Final Report for Nickel Cadmium Battery Expert System, Martin Marietta Corporation Airospace Division, 1986.

Jean Azieu, Hassan Smimite, Christian Glaize, "Improvement of intellligent battery controller: state–of–charge indicator and associated functions", Journal of Power Sources, 1997, pp. 157–161.

William Ross and Peter Budney, "Development of a Battery Runtime Prediction Algorithm and a Method for Determining its Accuracy", IEEE 1995, pp. 277–283.

S.A.G.R. Karunathilaka, R. Leek, N. A. Hampson, M. Hughes and T. J. Sinclair, "A state–of–charge test for the Li–CuO cell", Journal of Applied Electrochemistry (1983), pp. 351–354.

S.A.G.R. Karunathilaka, N.A. Hampson, M. Hughes, W.G. Marshall, R. Leek and T.J. Sinclair, "The prediction on the state–of–charge of some commerical primary cells", Journal of Applied Electrochemistry (1983), pp. 577–586.

Shigenori, et al., "Estimation of Residual Capacity of a Lead Battery using Neural Networks", Denki Gakkai Sangyo Keisoku seigyo Kenkyukai shiryo, 1993.

Tanpo N., "Development of a Battery Checking System using Neural Network", proceedings of the Joint Conference of Hokuruku Chapters of Institute of Elect. Eng., 1995.

Alex Bykat, "Design of an Expert System for Diagnosis of a Space Borne Battery Based Electric Power System", IEEE, IECEC, proceedings of the 25th Intersociety Energy Coversion Engineering Conference, Aug. 1990.

Taylor, et al., "Standard Smart Batteries for Consumer Applications", IEEE proceedings of the 10th Annual Battery Conference on Applications and Advances, Jan. 1995.

Tanpo, et al., "Estimation of the state–of–charge of Sealed Lead Battery by Neural Networks", The Institute of Electronics, Information and Communication Engineers, 1996.

Marcos Stoll, "Neural Networks—A Proper Approach to the Energy Management Problem?", Proceedings of the 10th E. C. Phatorotaic Solar Energy International Conference.

Tanpo et al., "Prediction of the Capacity of Sealed Lead Battery by Neural Networks", Conference proceedings of the Institute of Electronics, Information and Communication Engineers, 1996.

Tanpo, et al., "Development of a Battery Checking System Using Neural Network", proceedings of the Joint Conference of Hokuriku Chapters of Institutes of Electrical engineers, 1995.

* cited by examiner

METHOD AND SYSTEM FOR DETERMINING STATE-OF-HEALTH OF A LEAD-ACID DEFIBRILLATOR BATTERY USING AN INTELLIGENT SYSTEM

CROSS REFERENCE TO RELATED APPLICATIONS

This application is a Continuation-In-Part of U.S. patent application Ser. No. 09/041,501, filed Mar. 12, 1998, U.S. Pat. No. 6,456,988, which claims the benefit of U.S. provisional patent application Serial No. 60/040,476 filed Mar. 12, 1997 and claims the benefit of U.S. provisional patent application Serial No. 60/051,165, filed Jun. 27, 1997.

This invention was made with Government support under contract USZA22-97-P-0010 awarded by the U.S. Department of Defense. The Government has certain rights in the invention.

BACKGROUND

The present invention relates to determining the state-of-health (SOH) of an electrochemical device. More particularly, the present invention relates to determining the SOH of a lead-acid battery of the type used in portable defibrillators using an intelligent system, e.g. a fuzzy logic system.

The SOH of a battery, fuel cell, or other electrochemical device has been interpreted in different ways by scientists/engineers in the field. In the case of valve regulated lead acid (VRLA) batteries used by utility companies for providing emergency backup power, SOH is interpreted to mean that a battery is close to the end of its cycle life and needs replacement. Several papers including Feder and Hlavac 1994 INTELEC Conf. Proc. pp. 282–291 (1994) and Hawkins and Hand 1996 INTELEC Conf. Proc. pp. 640–645 (1996) demonstrate that the increase in impedance of aging VRLA batteries can be used to indicate the SOH of the battery.

Another interpretation of battery SOH is the capability of a battery to meet its load demand. This is also referred to as "battery condition" by others in the field. To obtain the SOH of a battery in the terms defined, both the available charge capacity of the battery and the maximum power available from the battery are required. Several approaches have been used to determine the condition of a battery. In U.S. Pat. No. 5,365,453 is described a method in which a ratio of a change in battery voltage to a change in load is used to predict impending battery failure in battery powered electronic devices. Similar methods in which the battery response to and recovery from the application of a load is used to determine the SOH of batteries are reported in U.S. Pat. Nos. 4,080,560 and 5,159,272. While these load profiling approaches work reasonably well for batteries integrated into a system, they are not necessarily accurate or reliable ways of determining the SOH of batteries outside a system.

SUMMARY

The above-discussed and other drawbacks and deficiencies of the prior art are overcome or alleviated by a method of and system for determining the state-of-health of a lead acid battery of the type commonly used in portable external defibrillators, the method comprising detecting an impedance characteristic of the battery at at least one selected frequency, counting the number of complete charge/discharge cycles that the battery undergoes, and determining the state of health of the battery from a fuzzy system trained in a relationship between the impedance characteristic and the cycle number of the lead acid battery and the state-of-health, wherein the state-of-health is a function of and varies with the battery's ability to deliver power required by the load and the battery's capacity to meet load requirements.

The above-discussed and other features and advantages of the present invention will be appreciated and understood by those skilled in the art from the following detailed description and drawings.

BRIEF DESCRIPTION OF THE DRAWINGS

Referring now to the drawings wherein like elements are numbered alike in the several figures.

DETAILED DESCRIPTION OF THE PREFERRED EMBODIMENTS

Figure 1:
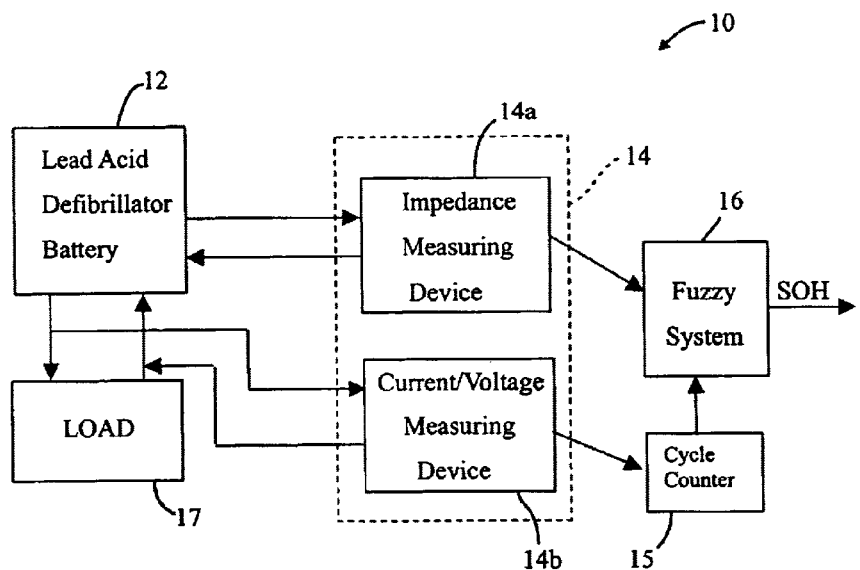
FIG. 1 is a block diagram of method for determining state-of-health of a lead acid defibrillator battery in accordance with the present invention.

Referring to FIG. 1 a system for determining the State-of-Health (SOH) in accordance with present invention is generally shown at 10. System 10 comprises lead acid battery 12 of the type used in portable external defibrillators, a load 17, which may be a portable external defibrillator, an impedance measuring device 14a of circuit 14, a current-voltage measuring device 14b, a cycle counter 15, and a fuzzy system 16. The battery 12 preferably comprises four 2V lead acid cells strung together in series and contains a fuse and a circuit board for a smart battery interface with a portable external defibrillator. Fuzzy system 16 is trained in the relationship between impedance (e.g., from impedance measuring device 14a) of the battery, the cycle number of the lead acid defibrillator battery under specific load conditions achieved by loading the battery with a load 17, and the SOH of the lead acid battery 12. The current draw of the load from the lead acid defibrillator battery and voltage across the battery are measured using the current/voltage measuring device 14b of circuit 14. A cycle is defined by the complete discharge of the battery followed by a complete recharge of the battery, the cycle number representing the number of battery cycles that the battery has completed. The impedance measurements are obtained by device 14a and along with cycle number provided to fuzzy system 16 as inputs, with the SOH being the output of fuzzy system 16.

The state-of-health of a lead-acid defibrillator battery is defined as the device's ability to perform a specified task.

Although a lead-acid defibrillator battery may be at a high State-of-Charge (SOC), its health may be poor due to loss of electrolyte or otherwise. Although a fully discharged lead acid defibrillator battery may be at a low SOC, due to depletion of the charged species of the electrodes or otherwise, it may well be in a full SOH, which would be realized subsequent to recharging the lead acid defibrillator battery. Phenomena such as loss of electrolyte and depletion of charged species affect the lead-acid defibrillator battery's power delivery capability and its capacity. Therefore, the lead-acid defibrillator battery's State-of-Health is a function of its ability to deliver power required by a load and its capacity to meet those requirements.

Figure 2:
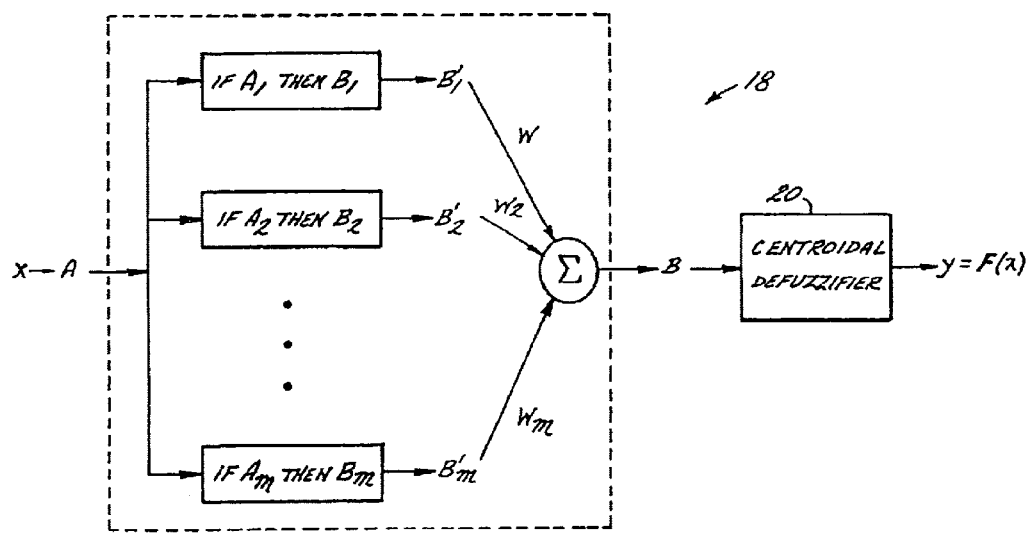
FIG. 2 is a block diagram of an additive fuzzy system for use in the present invention.

Referring to FIG. 2, a preferred embodiment of the fuzzy system comprises an additive fuzzy system 18 with centroid defuzzification 20. Additive fuzzy system 18 stores m fuzzy rules of the form, "if X is $A_j$ then Y is $B_j$", and computes the output F(x) as the centroid of the summed and partially fired then-part fuzzy sets $B'_j$, see Fuzzy Engineering by Bart Kosko, Prentice Hall, 1997. Mathematically, additive fuzzy system 18 is expressed by Equation 1 as:

$$F(x) = \frac{\sum_{j=1}^{m} w_j a_j(x) V_j c_j}{\sum_{j=1}^{m} w_j a_j(x) V_j}$$  EQUATION 1

$$a_j(x) = \prod_{i=1}^{n} a_j^i(x_i)$$  EQUATION 2

$$B = \sum_{j=1}^{m} w_j B'_j = \sum_{j=1}^{m} w_j a_j(x) B_j$$  EQUATION 3 where:
$w_j$ is a weight of rule j,
$a_j^i$ represents if-part set function (membership function of input i of rule j on input i),
$a_j$ represents joint if-part set function (result of "$a_j^1$ 'and' $a_j^2$ ... 'and' $a_j^i$") that states the degree to which the input x belongs to the if-part fuzzy set $a_j$,
$B_j$ represents then-part set function (membership function j on the output),
$V_j$ is the finite positive volume (or area) of the then-part set $B_j$,
$c_j$ is the centroid of the then-part set $B_j$,
$B'_j$ is the scaled then-part set (scaled output membership function j, result of $a_j(x)B_j$), and
B is the output set prior to defuzzification.

In linguistic terms, additive fuzzy system 18 can be described in terms of a set of if-then rules:

RULE 1: If $X_1$ is $a^1_1$ and $X_2$ is $a^2_1$ ... and $X_n$ is $a^n_1$, then F(X) is $B_1$,
RULE 2: If $X_1$ is $a^1_2$ and $X_2$ is $a^2_2$ ... and $X_n$ is $a^n_2$, then F(X) is $B_2$,
RULE m: If $X_1$ is $a^1_m$ and $X_2$ is $a^2_m$ ... and $X_n$ is $a^n_m$, then F(X) is $B_m$, where m is the number of rules and n is the number of inputs.

The linguistic description and the mathematical description of additive fuzzy system 18 are equivalent. They are merely different views of the same fuzzy system. Both approaches map a given input X to a given output F(X) by a process known as fuzzy inference. The following example demonstrates the fuzzy inference process. First, fuzzify the inputs by taking the inputs and determine the degree to which they belong to each of the appropriate input fuzzy sets via membership functions. Mathematically expressed as: "$a_1^1(X_1), a_1^2(X_2) \ldots a_1^m(X_m)$". Linguistically expressed as: "If $X_1 = a_1^1$, If $X_2 = a_1^2$, ..., If $X_m = a_1^m$". Second, apply a fuzzy operator by combining if-part sets of a given rule to obtain one number that represents the result of the antecedent for that rule. Mathematically expressed as EQUATION 2 hereinabove. Linguistically expresses as: "$a_1^1$ 'and' $a_1^2$ 'and' $a_1^m$" where 'and' is the T-norm product. Third, apply an implication method by shaping the consequent (or output fuzzy set) based on the result of the antecedent for that rule. Mathematically expressed as: "$B_1 = a_1(X)B_1$". Linguistically expressed as: "If $a_1(X)$, then $B_1$". Fourth, aggregate all outputs by combining the consequent of each rule to form one output fuzzy set. Mathematically expressed as EQUATION 3 hereinabove. Fifth, defuzzify by mapping the output fuzzy set to a crisp number. Mathematically expressed as "F(x)=centroid(B)=EQUATION 1". In general, see Fuzzy Logic Toolbox, for use with MATLAB, The Mathworks, Inc. by Jang and Gulley.

By way of example, a supervised gradient descent can learn or tune additive fuzzy system 18 given by EQUATION 1 by changing the rule weights $w_j$, the then-part volumes $V_j$, the then-part centroids $c_j$, or the if-part set functions $a_j$.

Figure 3A:
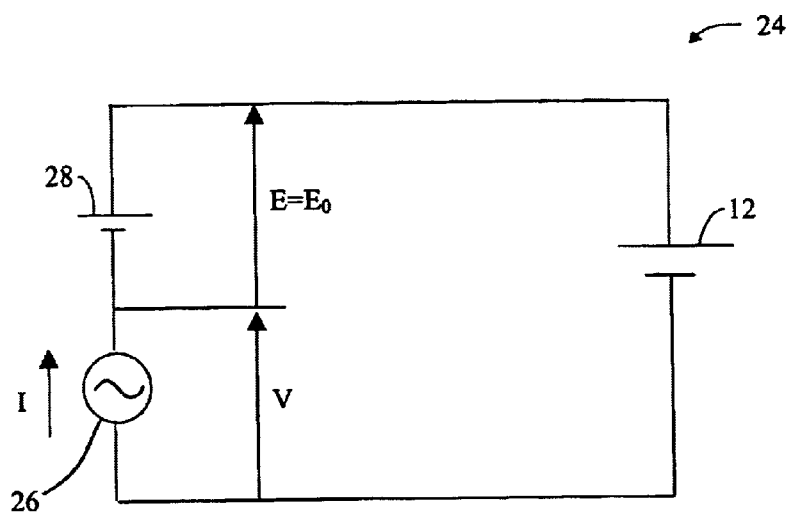
FIG. 3A is a schematic diagram of a circuit to measure battery impedance.

Referring to FIG. 3A, a n exemplary circuit 24 for measuring battery impedance is shown. Circuit 24 comprises battery 12 whose impedance is to be measured, an a.c. current generator 26 of variable frequency, and a d.c. variable voltage generator 28. Lead acid defibrillator battery 12 and generators 26 and 28 are connected in series in any order but in such a way that lead acid defibrillator battery 12 and d.c. generator 28 have in common poles of the same sign, in this example, positive poles. The no-load voltage of battery 12 is designated as $E_0$, the effective current of a.c. generator 26 is designated as I and the voltage of d.c. generator 28 is designated as E. Voltage E is chosen so as to be equal to $E_0$ to prevent battery 12 issuing a direct current. In this way, the current flowing in the loop made up of battery 12 and generators 26 and 28 has no direct component and its alternating component designated I determines the voltage drop V across the lead acid defibrillator battery 12. Variables V and I are complex numbers and their ratio V/I=Z=Z'+jZ" defines the internal complex impedance of lead acid defibrillator battery 12. This impedance has a real or resistive part Z' and an imaginary or reactive part Z". The magnitude of this impedance, |Z|, is given by $|Z|=(Z'^2+Z''^2)^{1/2}$. The phase angle of the impedance, θ, is given by $\theta = \tan^{-1}(Z''/Z')$. Battery impedance is a function of the frequency f of the a.c. current.

Figure 3B:
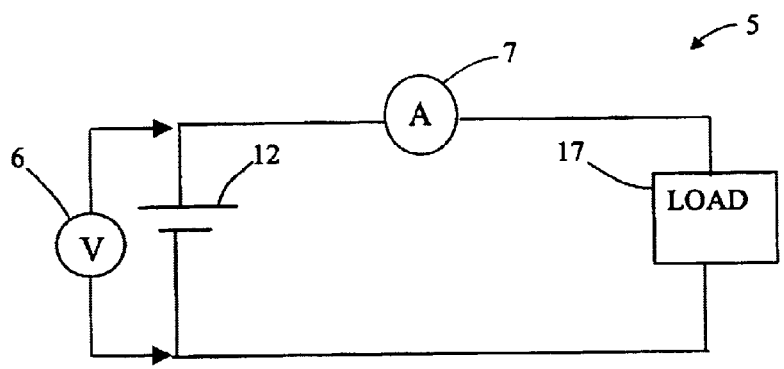
FIG. 3B is a schematic diagram of a circuit to measure the current and voltage delivered by the lead acid defibrillator battery to the load.

Referring to FIG. 3B, an exemplary circuit 5 for measuring the current draw of load 17 is connected to battery 12 and the voltage across battery 12 is shown. A voltmeter 6 is placed across the terminals of battery 12 such that the positive lead of the voltmeter is connected to the positive terminal of battery 12 and the negative lead of the voltmeter is connected to the negative terminal of the battery. An ammeter 7 is used to measure the current from battery 12 to the load 17. The ammeter 7 is connected in series between said lead acid defibrillator battery 12 and the load 17 such that the current must flow from battery 12 through the ammeter 7 to pass into the load.

Figure 4:
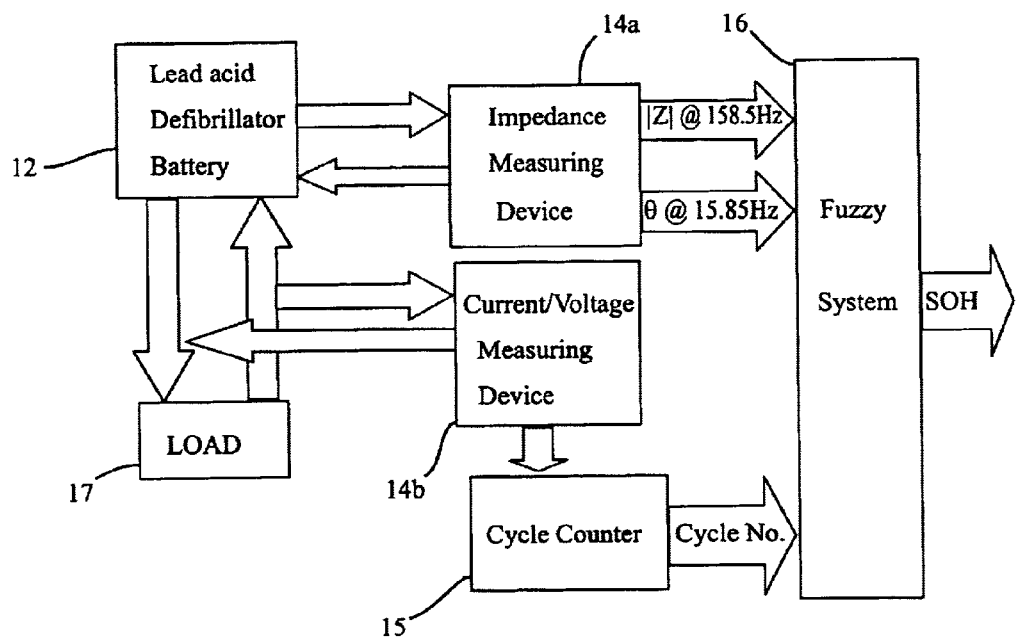
FIG. 4 is a block diagram of a fuzzy system for use in determining the state of health in the present invention.

Referring now to FIG. 4, an exemplary fuzzy system 16 is trained in the relationship between input characteristics of battery 12 and the SOH of battery 12. Specifically, the fuzzy system learns the underlying function F that relates the magnitude of the impedance |Z| at a first selected frequency, the phase angle of the impedance θ at a second selected frequency, and the cycle number, and the SOH of the lead acid defibrillator battery. The first selected frequency may be, for example, between about 20 Hz and about 10 kHz, preferably in the range from about 70 Hz to about 1000 Hz, and in the example shown, is 158 Hz (|Z| at 158.5 Hz). The second selected frequency may be between about 6 Hz and about 80 Hz, preferably between about 8 Hz and about 20 Hz, and in the example shown is 15.85 Hz (θ at 15.85 Hz).

While specific selected frequencies for measuring impedance and specific selected impedance characteristics (e.g., real part, imaginary part, magnitude, and phase angle) are listed herein and known to be effective, it understood that certain impedance characteristics at other various frequencies and/or fewer or more different frequencies may also be effective in obtaining a valid result. Furthermore, the optimal frequencies for measuring impedance may vary from one type of lead-acid battery to another, and can be determined empirically by mapping the impedances of the battery in various known conditions over a range of frequencies and selecting the frequency or frequencies and impedance characteristic(s) thereof at which it or they vary the most.

Figure 5:
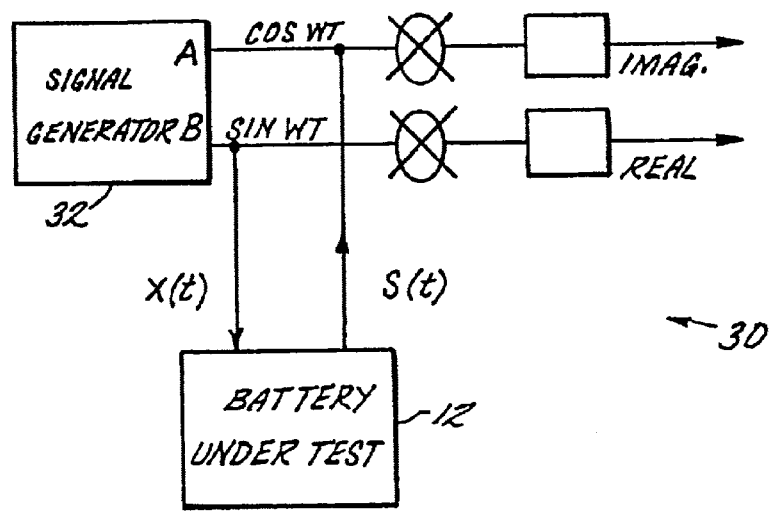
FIG. 5 is a circuit block diagram for determining Lead acid defibrillator battery impedance in accordance with the present invention.

Referring to FIG. 5, a circuit 30 for measuring impedance of battery 12 at the selected frequencies is generally shown. Circuit 30 comprises battery 12 whose impedance is to be measured and an a.c. signal generator 32. A small amplitude, perturbing sinusoidal signal, $x(t)=X_0 \sin(\omega t)$, is applied to lead acid defibrillator battery 12. The response of the lead acid defibrillator battery 12 to this perturbing signal is $S(t)=X_0 K(\omega)\sin(\omega[t+\phi(\omega)])$ and is correlated with two reference signals, one in phase with x(t) and the other 90° out of phase with x(t), i.e. $\sin(\omega t)$ and $\cos(\omega t)$, in order to calculate:

$$R = \frac{1}{T}\int_0^T S(t)\sin\omega t\, dt \qquad \text{EQUATION 4}$$

$$\Im = \frac{1}{T}\int_0^T S(t)\cos\omega t\, dt \qquad \text{EQUATION 5}$$

This allows the elimination of higher order harmonics than the fundamental and with an appropriate selection of frequency window and multiple measurements, noise rejection can be very high. In the limit as $$T\to\infty,\ R\to K(\omega)\cos\phi(\omega), \Im\to K(\omega)\sin\phi(\omega),$$

where $K(\omega)$ represents the amplitude of the impedance at a frequency $\omega/2\pi$ and $\phi(\omega)$ represents the phase of the impedance at frequency $\omega/2\pi$. Circuit 30 allows the determination of the impedance at different frequencies and may be set up to measure the impedance at the single frequency of interest. An exemplary commercially available instrument that can be used to perform the impedance measurements is the Solartron 1260 Inpedance/Gain-Phase Analyzer.

Figure 6:
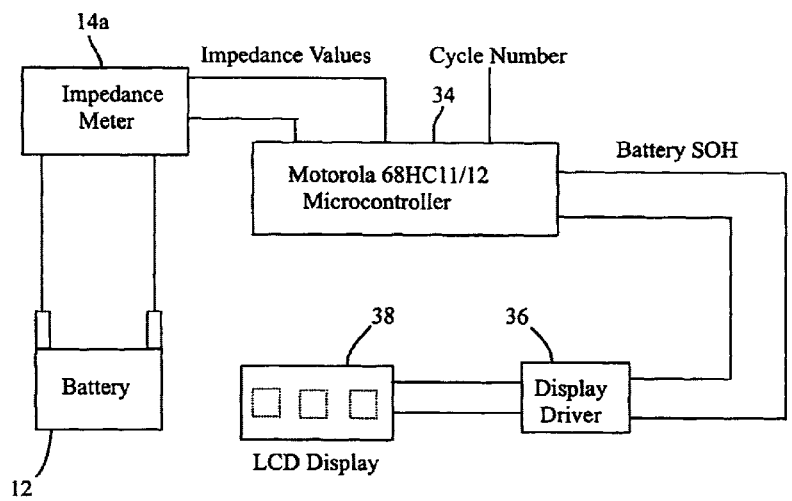
FIG. 6 is a circuit block diagram for determining state-of-health of lead acid defibrillator battery in accordance with the present invention.

To determine lead acid defibrillator battery SOH once the impedance is known, a circuit 34 (FIG. 6) may be used. The impedance values from impedance measurement device 14a together with the cycle number are fed into a microcontroller 34 (e.g. Motorola MC 68HC11/12) either as analog or digital signals, wherein analog signals would be fed into A/D converters on microcontroller 34 and converted to digital signals. The magnitude of the impedance at the first selected frequency, $Z_1$, e.g., 158.5 Hz, is stored in a first memory location and the phase angle of the impedance at the second selected frequency $Z_2$, e.g., 15.85 Hz, is stored in a second memory location, and the cycle number is stored at a third memory location. The three variables stored in the first, second and third memory locations serve as the input variables to the fuzzy system to determine the SOH of the battery 12. The output of this fuzzy system, the SOH of battery 12, is stored in a fourth memory location. The battery SOH is then output to a display driver 36 and interfaced to a liquid crystal or other display 38.

In one embodiment of this method, a fuzzy system implementation for determining the SOH of a Physio-Control/Medtronic 8V 2.5 Ah lead acid defibrillator cells. The lead acid defibrillator batteries are charged at a 0.9 A constant current for a period of 4 hours followed by a discharge at a constant current of 1A interrupted every 290 seconds by 7A pulses of 10 seconds duration. The discharge of the battery is continued at a 1A constant current rate interrupted every 290 seconds by 7A pulses of 10 seconds duration until the voltage across the battery reaches 7V. This embodiment estimates the number of 7A defibrillator pulses of 10s duration that may be obtained from said lead acid defibrillator battery every 5 minutes that is otherwise being discharged at a constant current of 1A. The larger the number of 7A defibrillator pulses that may be delivered by the battery, the better is considered the state-of-health of said defibrillator battery. The estimation of the number of defibrillator pulses that may be delivered to the load is provided as a function of cycle number over the range of $1^{st}$ cycle to $50^{th}$ cycle. A battery cycle includes the complete charging of the battery followed by a complete discharge of the battery employing the charging/discharging conditions described above.

Figure 7A:
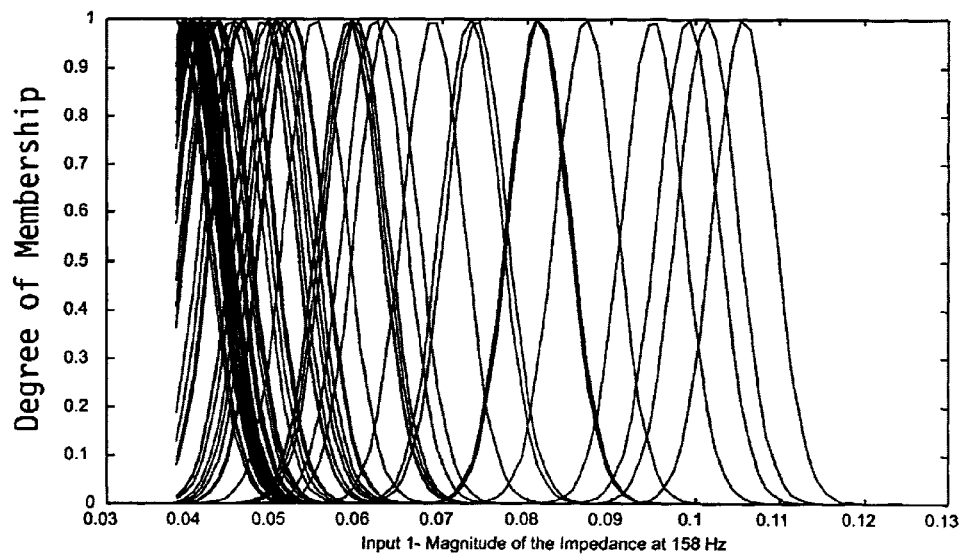
FIGS. 7A, 7B and 7C are membership functions for the three input variables used in the fuzzy system to determine state of health of Lead acid defibrillator battery in accordance with present invention.
Figure 7B:
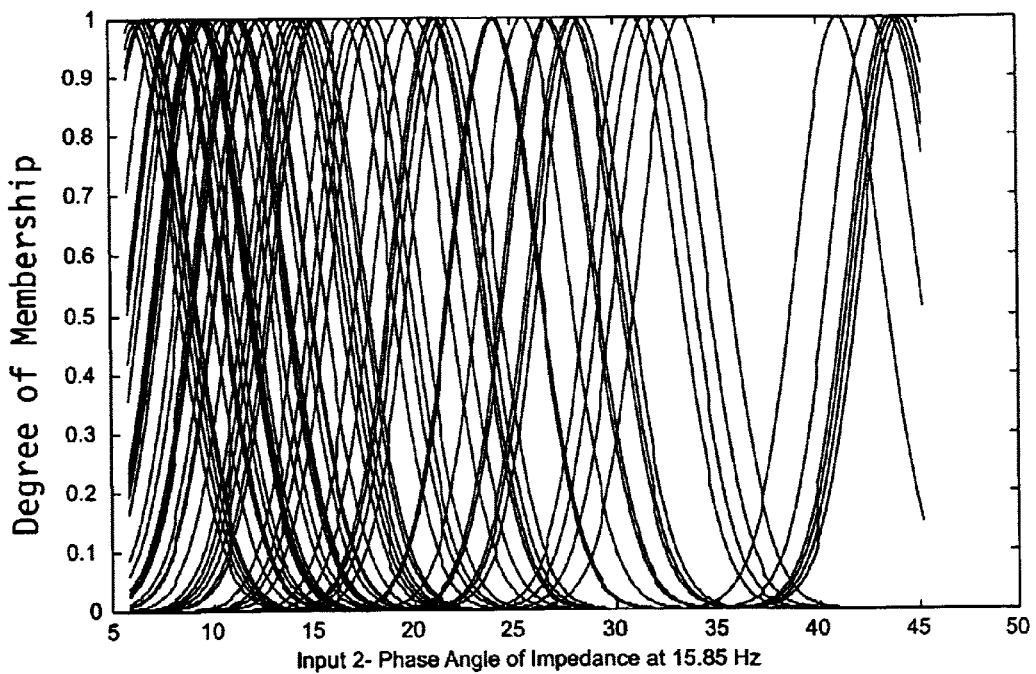
Figure 7C:
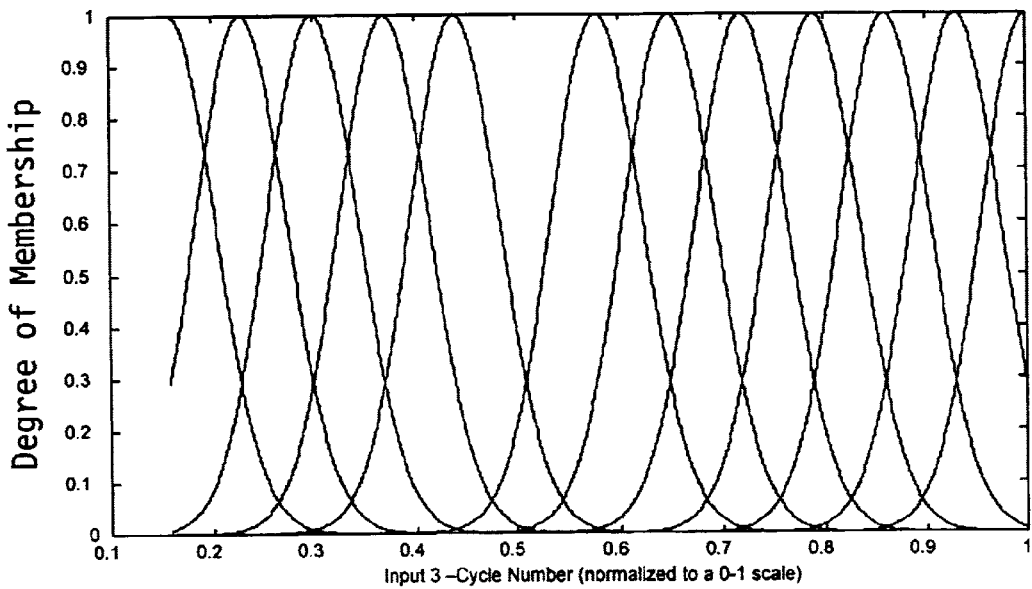

A 3-input 1-output fuzzy logic model is used to estimate the number of 7A pulses of 10s duration that may be delivered by the lead acid defibrillator battery every 5 minutes. The three inputs are the magnitude of the impedance at 158.5 Hz, the phase angle of the impedance at 15.85 Hz, and the normalized cycle number (cycle number/50) of the battery. The output of the model is the number of 7A pulses of 10s duration that may be delivered by the lead acid defibrillator battery. The input membership functions for the model are of Gaussian shape and are shown in FIG. 7. The output membership functions of the model are singletons. The rule set comprises 67 rules as given in Table 1.

TABLE 1

Fuzzy Logic Model Rules for Lead acid defibrillator Battery 7A Pulse Delivery Capability If (in1 is in1mf1) and (in2 is in2mf1) and (in3 is in3mf1) then (out1 is out1mf1)
If (in1 is in1mf2) and (in2 is in2mf2) and (in3 is in3mf2) then (out1 is out1mf2)
If (in1 is in1mf3) and (in2 is in2mf3) and (in3 is in3mf3) then (out1 is out1mf3)
If (in1 is in1mf4) and (in2 is in2mf4) and (in3 is in3mf4) then (out1 is out1mf4)
If (in1 is in1mf5) and (in2 is in2mf5) and (in3 is in3mf5) then (out1 is out1mf5)
If (in1 is in1mf6) and (in2 is in2mf6) and (in3 is in3mf6) then (out1 is out1mf6)
If (in1 is in1mf7) and (in2 is in2mf7) and (in3 is in3mf7) then (out1 is out1mf7)
If (in1 is in1mf8) and (in2 is in2mf8) and (in3 is in3mf8) then (out1 is out1mf8)
If (in1 is in1mf9) and (in2 is in2mf9) and (in3 is in3mf9) then (out1 is out1mf9)
If (in1 is in1mf10) and (in2 is in2mf10) and (in3 is in3mf10) then (out1 is out1mf10)
If (in1 is in1mf11) and (in2 is in2mf11) and (in3 is in3mf11) then (out1 is out1mf11)
If (in1 is in1mf12) and (in2 is in2mf12) and (in3 is in3mf12) then (out1 is out1mf12)

TABLE 1-continued

Fuzzy Logic Model Rules for Lead acid defibrillator Battery 7A Pulse Delivery Capability If (in1 is in1mf13) and (in2 is in2mf13) and (in3 is in3mf13) then (out1 is out1mf13)
If (in1 is in1mf14) and (in2 is in2mf14) and (in3 is in3mf14) then (out1 is out1mf14)
If (in1 is in1mf15) and (in2 is in2mf15) and (in3 is in3mf15) then (out1 is out1mf15)
If (in1 is in1mf16) and (in2 is in2mf16) and (in3 is in3mf16) then (out1 is out1mf16)
If (in1 is in1mf17) and (in2 is in2mf17) and (in3 is in3mf17) then (out1 is out1mf17)
If (in1 is in1mf18) and (in2 is in2mf18) and (in3 is in3mf18) then (out1 is out1mf18)
If (in1 is in1mf19) and (in2 is in2mf19) and (in3 is in3mf19) then (out1 is out1mf19)
If (in1 is in1mf20) and (in2 is in2mf20) and (in3 is in3mf20) then (out1 is out1mf20)
If (in1 is in1mf21) and (in2 is in2mf21) and (in3 is in3mf21) then (out1 is out1mf21)
If (in1 is in1mf22) and (in2 is in2mf22) and (in3 is in3mf22) then (out1 is out1mf22)
If (in1 is in1mf23) and (in2 is in2mf23) and (in3 is in3mf23) then (out1 is out1mf23)
If (in1 is in1mf24) and (in2 is in2mf24) and (in3 is in3mf24) then (out1 is out1mf24)
If (in1 is in1mf25) and (in2 is in2mf25) and (in3 is in3mf25) then (out1 is out1mf25)
If (in1 is in1mf26) and (in2 is in2mf26) and (in3 is in3mf26) then (out1 is out1mf26)
If (in1 is in1mf27) and (in2 is in2mf27) and (in3 is in3mf27) then (out1 is out1mf27)
If (in1 is in1mf28) and (in2 is in2mf28) and (in3 is in3mf28) then (out1 is out1mf28)
If (in1 is in1mf29) and (in2 is in2mf29) and (in3 is in3mf29) then (out1 is out1mf29)
If (in1 is in1mf30) and (in2 is in2mf30) and (in3 is in3mf30) then (out1 is out1mf30)
If (in1 is in1mf31) and (in2 is in2mf31) and (in3 is in3mf31) then (out1 is out1mf31)
If (in1 is in1mf32) and (in2 is in2mf32) and (in3 is in3mf32) then (out1 is out1mf32)
If (in1 is in1mf33) and (in2 is in2mf33) and (in3 is in3mf33) then (out1 is out1mf33)
If (in1 is in1mf34) and (in2 is in2mf34) and (in3 is in3mf34) then (out1 is out1mf34)
If (in1 is in1mf35) and (in2 is in2mf35) and (in3 is in3mf35) then (out1 is out1mf35)
If (in1 is in1mf36) and (in2 is in2mf36) and (in3 is in3mf36) then (out1 is out1mf36)
If (in1 is in1mf37) and (in2 is in2mf37) and (in3 is in3mf37) then (out1 is out1mf37)
If (in1 is in1mf38) and (in2 is in2mf38) and (in3 is in3mf38) then (out1 is out1mf38)
If (in1 is in1mf39) and (in2 is in2mf39) and (in3 is in3mf39) then (out1 is out1mf39)
If (in1 is in1mf40) and (in2 is in2mf40) and (in3 is in3mf40) then (out1 is out1mf40)
If (in1 is in1mf41) and (in2 is in2mf41) and (in3 is in3mf41) then (out1 is out1mf41)
If (in1 is in1mf42) and (in2 is in2mf42) and (in3 is in3mf42) then (out1 is out1mf42)
If (in1 is in1mf43) and (in2 is in2mf43) and (in3 is in3mf43) then (out1 is out1mf43)
If (in1 is in1mf44) and (in2 is in2mf44) and (in3 is in3mf44) then (out1 is out1mf44)
If (in1 is in1mf45) and (in2 is in2mf45) and (in3 is in3mf45) then (out1 is out1mf45)
If (in1 is in1mf46) and (in2 is in2mf46) and (in3 is in3mf46) then (out1 is out1mf46)
If (in1 is in1mf47) and (in2 is in2mf47) and (in3 is in3mf47) then (out1 is out1mf47)
If (in1 is in1mf48) and (in2 is in2mf48) and (in3 is in3mf48) then (out1 is out1mf48)
If (in1 is in1mf49) and (in2 is in2mf49) and (in3 is in3mf49) then (out1 is out1mf49)
If (in1 is in1mf50) and (in2 is in2mf50) and (in3 is in3mf50) then (out1 is out1mf50)
If (in1 is in1mf51) and (in2 is in2mf51) and (in3 is in3mf51) then (out1 is out1mf51)
If (in1 is in1mf52) and (in2 is in2mf52) and (in3 is in3mf52) then (out1 is out1mf52)
If (in1 is in1mf53) and (in2 is in2mf53) and (in3 is in3mf53) then (out1 is out1mf53)
If (in1 is in1mf54) and (in2 is in2mf54) and (in3 is in3mf54) then (out1 is out1mf54)
If (in1 is in1mf55) and (in2 is in2mf55) and (in3 is in3mf55) then (out1 is out1mf55)
If (in1 is in1mf56) and (in2 is in2mf56) and (in3 is in3mf56) then (out1 is out1mf56)
If (in1 is in1mf57) and (in2 is in2mf57) and (in3 is in3mf57) then (out1 is out1mf57)
If (in1 is in1mf58) and (in2 is in2mf58) and (in3 is in3mf58) then (out1 is out1mf58)
If (in1 is in1mf59) and (in2 is in2mf59) and (in3 is in3mf59) then (out1 is out1mf59)
If (in1 is in1mf60) and (in2 is in2mf60) and (in3 is in3mf60) then (out1 is out1mf60)
If (in1 is in1mf61) and (in2 is in2mf61) and (in3 is in3mf61) then (out1 is out1mf61)
If (in1 is in1mf62) and (in2 is in2mf62) and (in3 is in3mf62) then (out1 is out1mf62)
If (in1 is in1mf63) and (in2 is in2mf63) and (in3 is in3mf63) then (out1 is out1mf63)
If (in1 is in1mf64) and (in2 is in2mf64) and (in3 is in3mf64) then (out1 is out1mf64)
If (in1 is in1mf65) and (in2 is in2mf65) and (in3 is in3mf65) then (out1 is out1mf65)
If (in1 is in1mf66) and (in2 is in2mf66) and (in3 is in3mf66) then (out1 is out1mf66)
If (in1 is in1mf67) and (in2 is in2mf67) and (in3 is in3mf67) then (out1 is out1mf67)

where in1 is magnitude of impedance @ 158.5 Hz
in2 is phase angle of impedance @ 15.85 Hz
in3 is the normalized cycle number (cycle number/50) and
out1 is number of 7A pulses that the lead acid defibrillator battery can deliver to the load every 5 minutes at an otherwise 1A continuous discharge While preferred embodiments have been shown and described, various modifications and substitutions may be made thereto without departing from the spirit and scope of the invention. Terms such as "first" and "second" as used herein are not intended to imply an order of importance or location, but merely to distinguish between one element and another of like kind. It is to be understood that the invention has been described by way of illustration only, and such illustrations and embodiments as have been disclosed herein are not to be construed as limiting to the claims.

What is claimed is:

1. A method of determining a state-of-health of a lead acid battery, the method comprising:
   detecting an impedance characteristic of the battery at one or more selected frequencies;
   counting a number of complete charge/discharge cycles that the lead acid battery undergoes; and
   determining said state-of-health of said lead acid battery from a fuzzy system trained in a relationship between said impedance characteristic and said number of cycles of the lead acid battery and said state-of-health, wherein said state-of-health is a function of and varies with ability of the battery to deliver power required by a load and capacity of the battery to meet requirements of the load.

2. The method of claim 1 wherein said battery is a lead acid battery of the type used in portable external defibrillators, and said state-of-health is determined by said fuzzy system in terms of a number of defibrillator discharges that the battery can generate when fully charged.

3. The method of claim 1 wherein said detecting includes detecting an impedance magnitude at a tint selected frequency and an impedance phase angle at a second selected frequency.

4. The method of claim 3 wherein said first selected frequency is between about 20 Hz and about 10 kHz and said second selected frequency is between about 6 Hz and about 80 Hz.

5. The method of claim 4 wherein said first selected frequency is between about 70 Hz to about 1000 Hz and said second selected frequency is between about 8 Hz to about 20 Hz.

6. The method of claim 5 wherein said battery is a lead acid battery of the type used in portable external defibrillators, and said state-of-health is determined by said fuzzy system in terms of a number of defibrillator discharges that the battery can generate when fully charged.

7. The method of claim 6 wherein said first selected frequency is about 153.5 Hz and said second selected frequency is about 15.85 Hz.

8. A system for detecting a state-of-health of a lead acid battery, the system comprising:
    a microcontroller adapted to receive inputs from an impedance measurement device and a voltage measurement device, the microcontroller including software causing the microcontroller to perform operations including:
        storing an input value corresponding to an impedance characteristic at one or more selected frequencies;
        storing an input value corresponding to a cycle number, said cycle number being determined using said voltage measurement device;
        inputting each said input value into a fuzzy system trained in a relationship between each said input value and said state-of-health, said state-of-health being a function of ability of the battery to deliver power required by a load and capacity of the battery to meet requirements of the load; and
        storing an output value corresponding to said state-of-health of the battery, said output value being outputted from the fuzzy system.

9. The system of claim 8, said fuzzy system being implemented by said microcontroller.

10. The system of claim 8 wherein said battery is a lead acid battery of the type used in portable external defibrillators, and said state-of-health is determined by said fuzzy system n terms oft, a number of defibrillator discharges that the battery can generate when fully charged.

11. The system of claim 8 wherein said detecting includes detecting an impedance magnitude at a first selected frequency and an impedance phase angle at a second selected frequency.

12. The system of claim 8 wherein said first selected frequency is between about 20 Hz and about 10 kHz and said second selected frequency is between about 6 Hz and about 80 Hz.

13. The system of claim 12 wherein said first selected frequency is between about 70 Hz to about 1000 Hz and said second selected frequency is between about 8 Hz and about 20 Hz.

14. The system of claim 13 wherein said battery is a lead avid battery of the type used iii portable external defibrillators, and said state-of-health is determined by said fuzzy system in terms of tog number of defibrillator discharges that the battery can generate when fully charged.

15. The system of claim 14 wherein said first selected frequency is about 158.5 Hz and said second selected frequency is about 15.85 Hz.

16. A portable defibrillator having a lead acid battery, the portable defibrillator comprising:
    a microcontroller adapted to receive inputs from an impedance measurement device for measuring an impedance of said lead acid battery and a voltage measurement device for measuring a voltage of said lead acid battery, the microcontroller including software causing the microcontroller to perform operations including:
        storing an input value corresponding to an impedance characteristic at one or more selected frequencies;
        storing an input value corresponding to a cycle number, said cycle number being determined using said voltage measurement device;
        inputting each said input value into a fuzzy system trained in a relationship between each said input value and said a state-of-health, said state-of-health being a function of ability of the battery to deliver power required by a load and capacity of the battery to men lead requirements of the load; and
        storing an output value corresponding to said state-of-health of the battery, said output value being outputted from the fuzzy system.

17. The portable defibrillator of claim 16 wherein said fuzzy system is implemented by said microcontroller.

18. The portable defibrillator of claim 16 wherein said state-of-health is determined by said fuzzy system in terms of a number of defibrillator discharges that the battery cant generate when fully charged.

* * * * *